United States Patent
Mochizuki et al.

(12)

(10) Patent No.: US 6,696,529 B1
(45) Date of Patent: Feb. 24, 2004

(54) PHOTOSENSITIVE RESIN COMPOSITION, POROUS RESIN, CIRCUIT BOARD, AND WIRELESS SUSPENSION BOARD

(75) Inventors: Amane Mochizuki, Osaka (JP); Takahiro Fukuoka, Osaka (JP); Mitsuhiro Kanada, Osaka (JP); Takayuki Yamamoto, Osaka (JP); Tomohiro Taruno, Osaka (JP)

(73) Assignee: Nitto Denko Corporation, Osaka (JP)

( * ) Notice: Subject to any disclaimer, the term of this patent is extended or adjusted under 35 U.S.C. 154(b) by 447 days.

(21) Appl. No.: 09/721,666

(22) Filed: Nov. 27, 2000

(30) Foreign Application Priority Data

Nov. 26, 1999 (JP) ............................. 11-335851
Aug. 7, 2000 (JP) ....................... 2000-238807

(51) Int. Cl.⁷ .............................................. C08G 69/48
(52) U.S. Cl. ...................... 525/420; 525/423; 525/424; 525/425; 525/454; 525/534; 525/540
(58) Field of Search ................................ 525/454, 420, 525/423, 424, 425, 534, 540

(56) References Cited

U.S. PATENT DOCUMENTS

| 4,532,263 A | 7/1985 | Krutchen et al. ........... 521/133 |
| 4,535,100 A | 8/1985 | Krutchen et al. ........... 521/180 |
| 5,972,807 A | 10/1999 | Tani et al. |

FOREIGN PATENT DOCUMENTS

| EP | WO 99/28787 | 6/1999 |
| JP | 6-322168 | 11/1994 |
| JP | 9-100363 | 4/1997 |
| JP | 10-45936 | 2/1998 |

OTHER PUBLICATIONS

Patent Abstracts of Japan (publication No. 09/00363, Apr. 15, 1997).
XP–002160440—Abstract (1990).

*Primary Examiner*—John M. Cooney, Jr.
(74) *Attorney, Agent, or Firm*—Sughrue Mion, PLLC

(57) ABSTRACT

The present photosensitive resin composition 2 comprises a polyamic acid resin 4, a photosensitive agent, a dispersible compound 3 dispersible in the polyamic acid resin 4, and a solvent. The porous resin is obtained by removing the solvent from the photosensitive resin composition 2 to form a composition in which the dispersible compound 3 is dispersed in the polyamic acid resin 4, removing the dispersible compound to make the composition porous, and curing the porous photosensitive resin composition. The porous resin enables forming a fine circuit pattern and has a low dielectric constant and, when used as an insulating layer of a circuit board, brings about improved high frequency characteristics.

3 Claims, 9 Drawing Sheets

EXAMPLE 1

EXAMPLE 3

COMPARATIVE
EXAMPLE 1

PHOTOSENSITIVE RESIN COMPOSITION, POROUS RESIN, CIRCUIT BOARD, AND WIRELESS SUSPENSION BOARD

BACKGROUND OF THE INVENTION

1. Field of the Invention

This invention relates to a photosensitive resin composition, a porous resin, a circuit board, or a wireless suspension board. More particularly, it relates to a photosensitive resin composition and a porous resin prepared therefrom which are useful to form an insulating layer of a circuit board or a wireless suspension board, and a circuit board or wireless suspension board having the porous resin as an insulating layer.

2. Description of the Related Art

Having high heat resistance, dimensional stability and insulating properties, polyimide resins have been used widely as parts or members of electrical and electronic equipment and electronic components, such as circuit boards, which are required to assure high reliability. In recent years, as the electrical and electronic equipment has been gaining in performance and function, it has been demanded to store a large quantity of information and process and transmit the information at a high speed. Accordingly, the polyimide resins for use in such fields have been required to satisfy electrical characteristics coping with higher frequencies, i.e., to have low dielectric constant.

While the dielectric constant of plastic materials is generally decided by their molecular structure, reduction of dielectric constant of plastic materials achieved by alterations to the molecular structure is limited. As another approach, various techniques have been proposed to make plastic materials porous so that the dielectric constant may be controlled by the porosity, taking advantage of the low dielectric constant ($\in$) of air, which is 1.

Porous resins can be obtained by dry processes or wet processes. The dry processes include physical processes and chemical processes. The physical processes generally comprise dispersing a low-boiling liquid (blowing agent), such as chlorofluorocarbons, in a resin and heating the resin to volatilize the blowing agent thereby to generate cells to obtain foam. The chemical processes generally comprise adding a blowing agent to a resin and pyrolyzing the blowing agent to generate gas thereby to form cells and obtain foam. For example, U.S. Pat. No. 4,532,263 proposes a physical process for obtaining a polyetherimide foam structure by using methylene chloride, chloroform, trichloroethane, etc. as a blowing agent.

Processes for obtaining a foamed structure having a small cell diameter and a high cell density have recently been proposed, which comprise dissolving a gas such as nitrogen or carbon dioxide in a resin under high pressure, releasing the pressure, and heating the resin to around the glass transition point or softening point thereof to form cells. Microporous foams can be obtained by this technique. For example, JP-A-6-322168 proposes applying the technique to polyetherimide resins to obtain a heat-resistant foam. JP-A-10-45936 proposes applying the technique to styrene resins having a syndiotactic structure to obtain a foam having a cell size of 0.1 to 20 µm, which is used as a circuit member. JP-A-9-100363 discloses a low-dielectric constant insulating plastic film having a heat resistance of 100° C. or higher and a dielectric constant of 2.5 or smaller which comprises a porous resin having a porosity of 10 vol % or higher obtained by using carbon dioxide, etc. as a blowing agent.

The above-described processes of the related art of obtaining porous resins have their several disadvantages as follows. The chlorofluorocarbons used as a blowing agent in the physical processes are unfavorable for safety and the possibility of destroying the ozonophere. In addition, it is difficult with the physical processes to obtain a foamed structure with a small and uniform cell size.

The chemical processes involve the fear of the chemical blowing agent's remaining in the foam after expansion, which makes the foam unsuitable to applications where freedom from contaminants is heavily demanded, such as electrical and electronic equipment.

The techniques comprising dissolving gas in a resin under high pressure, releasing the pressure, and heating the resin to around the glass transition point or softening point to form cells have the following disadvantages. In JP-A-6-322168, the resin is impregnated with high pressure gas in a pressure vessel while being heated to or around the Vicat softening point. Therefore, when the pressure is released, the resin is in its molten state so that the high pressure gas readily expands to provide a foam which does not form fine cells. It follows that the foam, when used as a circuit board, should have a large thickness or has a limit in forming fine patterns. In JP-A-10-45936, since the glass transition temperature of the styrene-based resin is around 100° C., it is not possible to use the resin at a high temperature higher than that glass transition temperature. Furthermore, in JP-9-100363, the foam does not form so fine cells and has a limit in forming fine patterns.

SUMMARY OF THE INVENTION

Accordingly, an object of the present invention is to provide a porous resin which is fine and uniform in cell size as well as excellent in heat resistance, dimensional stability and insulating properties.

Another object of the invention is to provide a photosensitive resin composition for obtaining the porous resin.

Still another object of the invention is to provide a circuit board or a wireless suspension board, which uses the porous resin as an insulating layer.

In order to accomplish the above objects, the invention provides a photosensitive resin composition comprising a polyamic acid resin, a photosensitive agent, a dispersible compound that is dispersible in the polyamic acid resin, and a solvent.

In the photosensitive resin composition according to the invention, the dispersible compound is preferably at least one compound selected from the group consisting of a polyacrylate oligomer, a polyether oligomer, a polyester oligomer, and a polyurethane oligomer.

The invention also provides a porous resin which is obtained by a process including the steps of removing the solvent from the photosensitive resin composition of the invention to form a composition in which the dispersible compound is dispersed in the polyamic acid resin, removing the dispersible compound to form a porous photosensitive resin composition, and curing the photosensitive resin composition. The process preferably comprises the additional step of patterning the photosensitive resin composition by exposure and development.

The porous resin of the invention is suited for use as an insulating layer of a circuit board, especially of a wireless suspension board.

The invention also provides a circuit board and a wireless suspension board, which comprises the porous resin as an insulating layer.

BRIEF DESCRIPTION OF THE DRAWINGS

FIGS. 1A to 1E show a process for forming an insulating layer of a porous resin in the manufacture of a circuit board, in which:

FIG. 1A is the step of preparing a substrate,

FIG. 1B is the step of forming a photosensitive layer of a photosensitive resin composition on the substrate, FIG. 1C is the step of exposing the photosensitive layer through a photo mask and developing the latent image to make a predetermined pattern, FIG. 1D is the step of removing a dispersible compound from the photosensitive resin composition to make the photosensitive layer porous, and FIG. 1E is the step of curing the porous layer to form a porous insulating layer (base layer).

FIGS. 2A and 2B show the steps of forming a conductive layer on the base layer of FIG. 1E and the step of forming a covering layer thereon, in which:

FIG. 2A is the step of forming a conductive layer on the base layer, and

FIG. 2B is the step of forming a covering layer on the conductive layer.

FIGS. 4A to 4E illustrate the steps of forming an insulating layer on a substrate in a predetermined pattern, in which:

FIG. 4A is the step of preparing a substrate,

FIG. 4B is the step of forming a photosensitive layer of a photosensitive resin composition on the substrate, FIG. 4C is the step of exposing the photosensitive layer through a photo mask and developing the latent image to make a predetermined pattern, FIG. 4D is the step of removing a dispersible compound from the photosensitive resin composition to make the photosensitive layer porous, and FIG. 4E is the step of curing the porous layer to form a porous insulating layer (base layer).

FIGS. 5A to 5E show the steps for forming a conductive layer on the base layer of FIG. 4E in a predetermined circuit pattern, in which:

FIG. 5A is the step of providing the substrate and the base layer with an undercoat, FIG. 5B is the step of forming on the undercoat a plating resist having a reverse pattern of the predetermined circuit pattern, FIG. 5C is the step of forming a conductive layer in the predetermined circuit pattern on the exposed base layer, FIG. 5D is the step of removing the plating resist, and FIG. 5E is the step of removing the exposed undercoat.

FIGS. 6A to 6C show the steps for protecting the conductive layer of FIG. 5E with a metallic film and covering with a covering layer, wherein:

FIG. 6A is the step of forming a metallic film on the surface of the conductive layer, FIG. 6B is the step of forming a covering layer over the base layer and the metallic film, and FIG. 6C is the step of stripping the metallic film formed on the substrate.

DETAILED DESCRIPTION OF THE INVENTION

Figure 1A:

The photosensitive resin composition according to the invention comprises a polyamic acid resin, a photosensitive agent, a dispersible compound dispersible in the polyamic acid resin, and a solvent.

The polyamic acid resin which can be used in the invention is a polyimide resin precursor obtainable by the reaction between an organic tetracarboxylic acid dianhydride and a diamine. The organic tetracarboxylic acid dianhydride includes pyromellitic dianhydride, 3,3',4,4'-biphenyltetracarboxylic acid dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic acid dianhydride, bis(3,4-dicarboxyphenyl) ether dianhydride, and bis(3,4-dicarboxyphenyl)sulfonic acid dianhydride. These acid dianhydride components can be used either individually or as a combination of two or more thereof.

The diamine includes m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl) propane, 2,2-bis(4-aminophenoxyphenyl) hexafluoropropane, 1,3-bis(4-aminophenoxy)benzene, 1,4-bis(4-aminophenoxy)benzene, 2,4-diaminotoluene, 2,6-diaminotoluene, diaminodiphenylmethane, 4,4'-diamino-2,2-dimethylbiphenyl, and 2,2-bis(trifluoromethyl)-4,4'-diaminobiphenyl. These diamine components can be used either individually or as a combination of two or more thereof.

The acid dianhydride component and the diamine component are used at a practically equimolar ratio. The reaction is carried out in an appropriate organic solvent such as a polar solvent (e.g., N-methyl-2-pyrrolidone, N,N-dimethylacetamide, N,N-dimethylformamide or dimethyl sulfoxide) usually at 0 to 90° C. for 1 to 24 hours to obtain a polyamic acid resin in the form of a solution. The polyamic acid resin thus prepared has a repeating unit represented by formula (I):

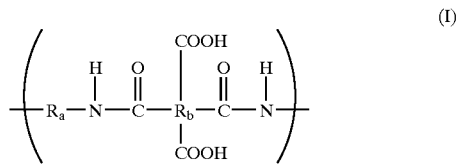

wherein Ra represents a divalent organic group; and Rb represents a tetravalent organic group.

The polyamic acid resin usually has a weight average molecular weight of about 5,000 to 200,000, preferably about 10,000 to 100,000.

The photosensitive agent which can be used in the invention is not particularly limited as long as it is capable of providing a contrast in solubility between exposed areas and unexposed areas when the polyamic acid resin is exposed to light. Examples of useful photosensitive agents include dihydropyridine derivatives, diazonaphthoquinone sulfonic acid ester derivatives, and aromatic diazide compounds.

Preferred of these photosensitive agents are dihydropyridine derivatives for their high resolution. As described in JP-A-6-75376, the dihydropyridine derivatives are represented by formula (II):

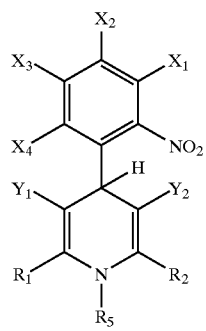

(II)

wherein $X_1$, $X_2$, $X_3$, and $X_4$ each represent a hydrogen atom, a fluorine atom, a nitro group, a methoxy-group, an amino group, a dialkylamino group, a cyano group or a fluoroalkyl group; $Y_1$ represents a cyano group or —$COR_3$; $Y_2$ represents a cyano group or —$COR_4$; $R_3$ and $R_4$ each represent an alkyl group having 1 to 4 carbon atoms, an alkoxy group, an anilino group, a toluidino group, a benzyloxy group, an amino group or a dialkylamino group; $R_1$, $R_2$, and $R_5$ each represent a hydrogen atom or an alkyl group having 1 to 3 carbon atoms; $R_1$ and $R_3$, and $R_2$ and $R_4$ may be taken together to form a 5-membered ring or heterocyclic ring containing the keto group, respectively.

Specific examples of the dihydropyridine derivatives of formula (II) are 4-o-nitrophenyl-3,5-dimethoxycarbonyl-2,6-dimethyl-1,4-dihydropyridine (hereinafter referred to as nifedipine), 4-o-nitrophenyl-3,5-dimethoxycarbonyl-2,6-dimethyl-1-methyl-4-hydropyridine (hereinafter referred to as an N-methyl compound), and 4-o-nitrophenyl-3,5-diacetyl-1,4-dihydropyridine (hereinafter referred to as an acetyl compound). They may be used either individually or as a combination of two or more thereof.

The photosensitive agent is usually used in an amount ranging from 0.05 to 0.5 mol per mole of the total of the acid dianhydride component and the diamine component, i.e., the polyamic acid. If desired, the photosensitive composition can contain imidazole as a solubility enhancing agent in a developing solution hereinafter described. Imidazole is preferably added in an amount of 0.05 to 0.5 mol per mole of the total of the acid dianhydride component and the diamine component, i.e., the polyamic acid.

The dispersible compound which can be used in the invention is a compound that is dispersible in the polyamic acid resin and, more specifically, a compound which forms a sea-island structure by micro phase separation in the form of fine particles in the polyamic acid resin matrix. Such a compound is not particularly limited, but a compound that is not completely compatible with the polyamic acid resin is preferred. A compound which is volatilizable on heating, decomposable on heating into carbon (carbonization), or extractable with a specific solvent is preferably used. Such a compound includes oligomers of relatively low degree of polymerization composed of at least two monomer units of a kind or different kinds, for example, polyacrylate oligomers, polyether oligomers, polyester oligomers, and polyurethane oligomers.

The polyacrylate oligomers include hexanediol di(meth)acrylate, neopentyl glycol di(meth)acrylate, trimethylolpropane tri(meth)acrylate, dipentaerythritol hexa(meth)acrylate, epoxy (meth)acrylate, and oligoester (meth)acrylate.

The polyether oligomers include polyethylene glycol, polypropylene glycol, and polybutylene glycol. One or both of the end groups of these polyols may be blocked with a methyl group, a phenyl group or a (meth)acrylic ester group.

The polyester oligomers include ∈-caprolactone, of which one or both of the ends groups may be blocked with a methyl group, a phenyl group or a (meth)acrylic ester group.

The polyurethane oligomers include urethane polyols, such as the reaction product between a macropolyol (e.g., polyether polyol, polyester polyol, polycarbonate polyol, and polybutadiene polyol) and a polyisocyanate monomer; and urethane acrylates, such as the reaction product between a hydroxyl-containing (meth)acrylate monomer (e.g., hydroxyethyl (meth)acrylate, phenyl glycidyl ether acrylate, pentaerythritol triacrylate, and glycerol dimethacrylate) and a polyisocyanate monomer (e.g., methylene diisocyanate, tolylene diisocyanate, and isophorone diisocyanate) or the above-described urethane polyol.

The dispersible compounds can be used either individually or as a combination of two or more thereof. The dispersible compound preferably has a weight average molecular weight of 150 to 10,000, particularly 300 to 5,000. A dispersible compound whose weight average molecular weight is smaller than 150 tends to mutually dissolve in the polyamic acid resin, failing to form a sea-island structure. A dispersible compound whose weight average molecular weight exceeds 10,000 tends to be difficult to finely disperse in the polyamic acid resin matrix.

The dispersible compound is usually used in an amount of 200 parts by weight or less per 100 parts by weight of the polyamic acid resin. In order to obtain a porous resin having a small cell size (less than 10 μm, preferably less than 2 μm) the amount is preferably 10 to 200 parts by weight. In order to reduce the dielectric constant to 3 or lower, preferably 2.5 or lower, the amount is still preferably 30 to 100 parts by weight.

The reaction solvent used for the synthesis of the polyamic acid resin can serve as such as a solvent of the photosensitive resin composition. If desired, one or more than one other organic solvents may be used in place of, or in addition to, the reaction solvent used. Useful organic solvents include 1,3-dimethyl-2-imidazolidinone, diglyme, triglyme, tetrahydrofuran, dioxane, cyclohexane, toluene, and xylene. While the amount of the solvent is arbitrary, it is appropriately selected so as to adjust the viscosity of the photosensitive resin composition in conformity to the purpose and use. It is usually 1 to 100 times, preferably 2 to 50 times, the total weight of the polyamic acid resin, the photosensitive agent, and the dispersible compound.

The photosensitive resin composition is prepared by compounding the polyamic acid resin, the photosensitive agent, the dispersible compound, and the solvent in the above-described ratio in an appropriate conventional manner. The photosensitive resin composition of the invention is fit as a material providing a porous resin having high heat resistance, dimensional stability and insulating properties which contains fine and uniform cells and exhibits a low dielectric constant and capability of forming a fine pattern, particularly a porous resin for forming an insulating layer of a circuit board.

The process of producing a porous resin from the photosensitive resin composition of the invention will now be described with particular reference to a circuit board having an insulating layer of the porous resin.

Figure 1B:
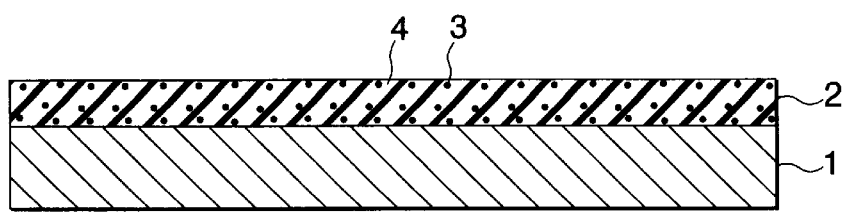

As illustrated in FIGS. 1A and 1B, a photosensitive resin composition 2 is applied to a substrate 1 and dried by, for example, hot air drying, to remove the solvent and thereby form a photosensitive layer 2.

Useful substrates 1 include a foil or a plate of a metal or an alloy, such as copper, aluminum, stainless steel, copper-beryllium, phosphor bronze and iron-nickel; a ceramic foil or plate, such as a silicon wafer and glass; and a film of plastics, such as polyimide and polyester.

The method of applying the photosensitive resin composition is selected from conventional coating techniques such as spin coating and bar coating according to the shape of the substrate or a desired coating thickness. The composition is preferably applied to a dry thickness of 0.1 to 50 $\mu$m, particularly 1 to 25 $\mu$m. If desired, a silane coupling agent or a titanate coupling agent may previously be applied to the substrate 1 to improve adhesion to the photosensitive resin composition.

The drying is usually at 40 to 150° C. The rate of solvent removal is slow below 40° C. Drying above 150° C. tends to initiate imidation of the polyamic acid resin. A preferred drying temperature is 60 to 100° C. On solvent removal by drying, the dispersible compound 3 gets insolubilized in the polyamic acid resin 4 to cause micro phase separation as fine particles to form a sea-island structure of the dispersible compound 3 in the polyamic acid resin 4, as schematically illustrated in FIG. 1B.

Figure 1C:
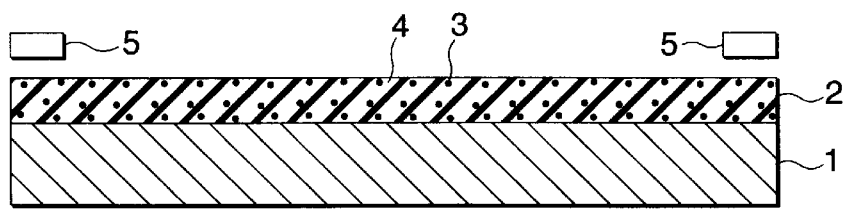

As shown in FIG. 1C, the photosensitive layer 2 is then imagewise exposed to active light via a photo mask 5, if necessary, followed by heating, to form a positive or negative latent image, which is developed to form a positive or negative pattern. In case where nifedipine is used as a photosensitive agent, for example, when the photosensitive layer is heated after exposure at a relatively low temperature around 140° C., the exposed area becomes soluble in a developing solution to provide a positive image; and when, on the other hand, the heating is at a relatively high temperature above about 170° C., the unexposed area becomes soluble to form a negative image, while the critical temperature somewhat varies depending on the photosensitive agent used. The latent image thus formed is then developed with a developing solution in a conventional manner by, for example, dipping or spraying. A suitable developing temperature is usually 25 to 50° C. The developing solution includes an aqueous solution of an inorganic or organic alkali, e.g., tetramethylammonium hydroxide, sodium hydroxide, and potassium hydroxide. The alkali concentration suitably ranges from 2 to 5% by weight. If desired, the developing solution can contain an aliphatic lower alcohol, such as methanol, ethanol, n-propanol, and isopropyl alcohol, usually in a concentration of 50% by weight or less.

Figure 1D:
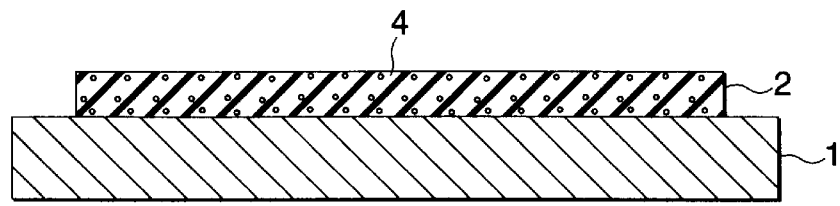

In the above-described patterning method, it is preferred to pattern the photosensitive layer in a negative mode, which is illustrated in FIG. 1D.

The polyamic acid resin 4 forming the photosensitive layer 2 can be made porous by removing the dispersible compound 3 from the photosensitive resin composition 2 as shown in FIG. 1D.

Removal of the dispersible compound from the photosensitive resin composition can be achieved in a known manner. For example, the dispersible compound is vaporized or decomposed into carbon (carbonized) by heating or extracted with a prescribed solvent. Solvent extraction is preferred; for there is no possibility of the dispersible compound's remaining unremoved which might be observed in the case of the heating method, thereby to further lower the dielectric constant.

The extracting solvent can be chosen from commonly employed organic solvents according to the composition of the polyamic acid resin or the kind of the dispersible compound. Useful organic solvents include polar solvents, such as N-methyl-2-pyrrolidone, N,N-dimethylacetamide, N,N-dimethylformamide, 1,3-dimethyl-2-imidazolidinone, dimethyl sulfoxide, diglyme, and triglyme; ethers, such as tetrahydrofuran and dioxane; ketones, such as cyclohexanone, methyl ethyl ketone, and acetone; aromatic hydrocarbons, such as toluene and xylene; and alcohols, such-as methanol, ethanol, and isopropyl alcohol. These solvents can be used either individually or as a combination of two or more thereof.

It is preferred to carry out the solvent extraction with liquefied carbon dioxide or carbon dioxide in a high temperature and high pressure state or in a super critical state as an extracting solvent. When such carbon dioxide is used for extraction, the extraction efficiency can be greatly improved and porous polyimide layer can be formed well. In this case the extraction is preferably performed in a pressure vessel at 0 to 150° C., particularly 20 to 120° C., under a pressure of 3.5 to 100 MPa, particularly 6 to 50 MPa.

The step of removing the dispersible compound from the photosensitive resin composition can be conducted in any stage of the process for obtaining a porous resin from the photosensitive resin composition, and the operation for removing the dispersible compound may constitute an independent step or may be effected throughout the process. While this step has been described above as one following the step of patterning and preceding the step of curing hereinafter described, it can be carried out in any stage after the solvent is removed from the photosensitive resin composition to have the dispersible compound dispersed in the polyamic acid resin matrix. For example, the step of removing the dispersible compound can be performed either once or more than once before exposure, after exposure and before heating, after heating and before development, after development, or before or after curing.

Figure 1E:
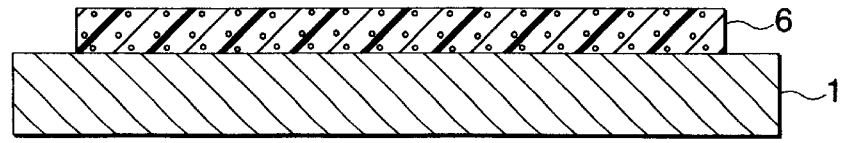

The photosensitive layer 2 is cured to form an insulating layer 6 comprising the porous resin as shown in FIG. 1E. Curing can be carried out in a known manner. For example, the photosensitive layer 2 is heated at about 350 to 400° C. for several hours in vacuo or in an inert gas atmosphere whereby the polyamic acid resin is imidized into a polyimide resin.

Figure 2A:
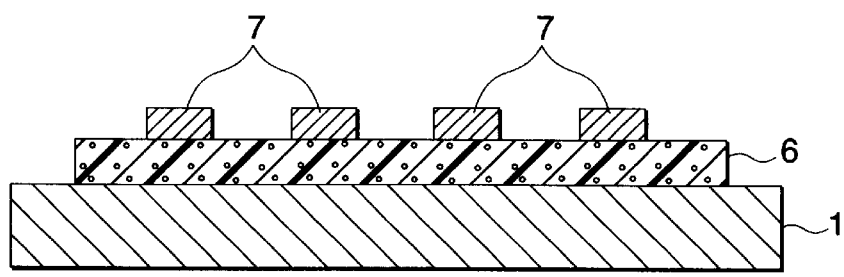
Figure 2B:
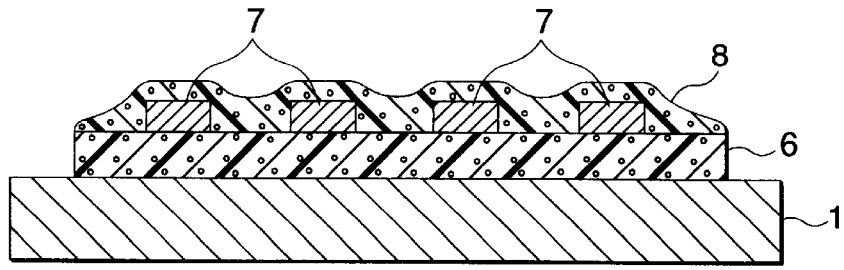

A circuit board having the insulating layer 6 can be produced by providing a conductive layer 7 having a prescribed circuit pattern on the insulating layer 6 as base layer 6, by a known patterning technique, such as a subtractive method, an additive method, a semi-additive method and the like as shown in FIG. 2A. If desired, the conductive layer 7 can be protected with a covering layer 8 as shown in FIG. 2B. The conductor which forms the conductive layer 7 includes copper, nickel, gold, solder and alloys thereof. The conductive layer 7 usually has a thickness of 1 to 15 $\mu$m. The covering layer 8 can be of the porous resin according to the invention or any other known resins commonly employed in the art. The thickness of the covering layer 8 is usually 2 to 25 $\mu$m.

Since the insulating layer thus obtained comprises a polyimide resin, it has high heat resistance, dimensional stability and insulating properties. Besides, it has fine and uniform cells smaller than 10 μm, preferably smaller than 5 μm, so that it enables forming a circuit pattern of fine lines and spaces. In addition, it has a dielectric constant of 3 or less, preferably 2.5 or less, which secures improved high-frequency characteristics. Therefore, the insulating layer is suitable as a base layer or a covering layer of a circuit board, especially a flexible wiring board. The circuit board comprising the insulating layer is capable of transmitting high frequency electrical signals at a high speed effectively.

In particular, the insulating layer comprising the porous resin of the invention is suitable as an insulating layer of a wireless suspension board on which a magnetic head of a hard disc driver is mounted. The wireless suspension board having such an insulating layer is capable of transmitting huge quantities of information at a high speed.

A specific embodiment of the use of the porous resin in such a wireless suspension board will then be described.

Figure 3:
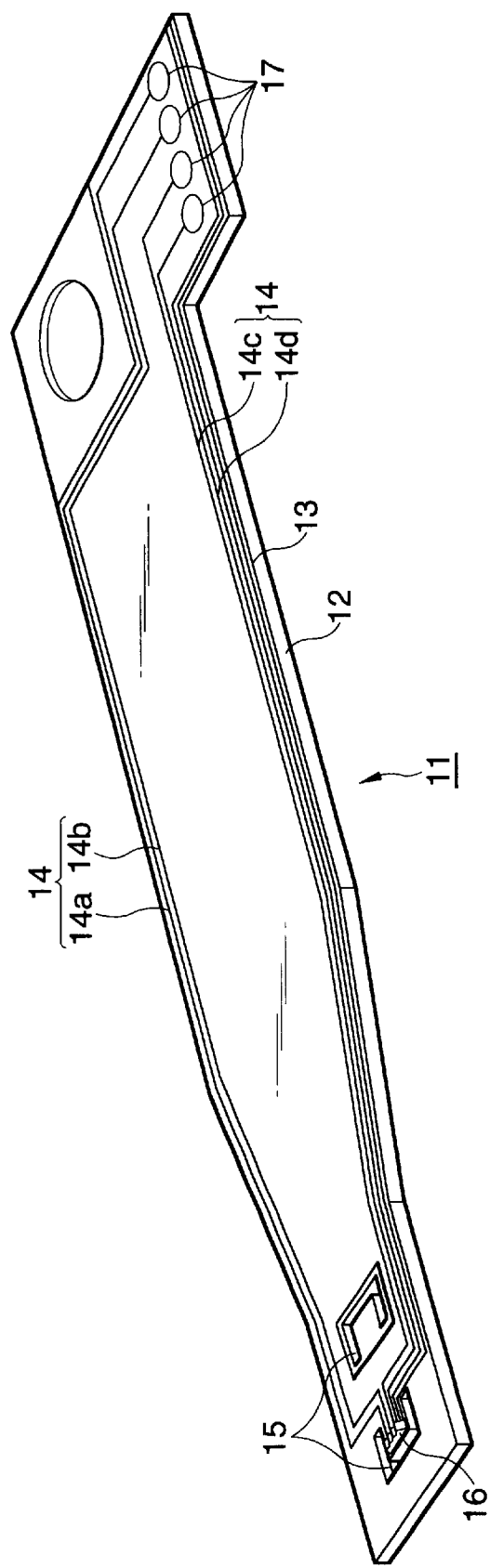
FIG. 3 is a perspective view of a wireless suspension board in which the porous resin of the invention is used as an insulating layer.

FIG. 3 is a perspective view of an example of a wireless suspension board in which the porous resin of the invention is used as an insulting layer.

The wireless suspension board 11 shown in FIG. 3 is designed to have a magnetic head (not shown) of a hard disc driver mounted thereon while keeping a small gap between the head and the disc against the air flow generated when the head and the disc run relatively. A wiring pattern for connecting the magnetic head to a read/write board as an external circuit is integrally formed on the suspension board.

The circuit-provide suspension board 11 comprises an oblong substrate 12, an insulating layer (base layer) 13 provided on the substrate, and a conductive layer 14 having a prescribed circuit pattern provided on the base layer 13. The circuit pattern has a plurality of wires 14a, 14b, 14c, and 14d which are spaced at predetermined intervals in parallel to each other. A gimbal 15 for mounting a magnetic head is engraved at the head portion of the substrate 12. Terminals 16 connecting the magnetic head and the wires 14a, 14b, 14c, and 14d and terminals 17 connecting the wires to an external read/write circuit are formed on the head and the tail portions of the substrate 12. While not shown in FIG. 3, the conductive layer 14 is protected with a covering layer 18 comprising an insulator.

A process for producing the wireless suspension board having the structure shown in FIG. 3 will be explained by referring to FIGS. 4 through 6, which are cross sections of the ciruicuit-provided suspension board 11 or precursors thereof taken along a line perpendicular to the lengthwise direction in each step of the process involved.

FIGS. 4A to 4E show the process for making an insulating layer (base layer) of a prescribed pattern on a substrate 12. The substrate 12 is preferably a foil or thin plate of metal, such as stainless steel or 42 alloy, having a thickness of 10 to 60 μm, particularly 15 to 30 μm, and a width of 50 to 500 mm, particularly 125 to 300 mm.

Figure 4A:
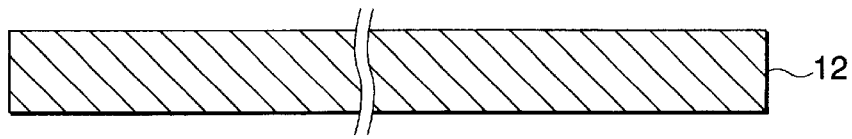
Figure 4B:
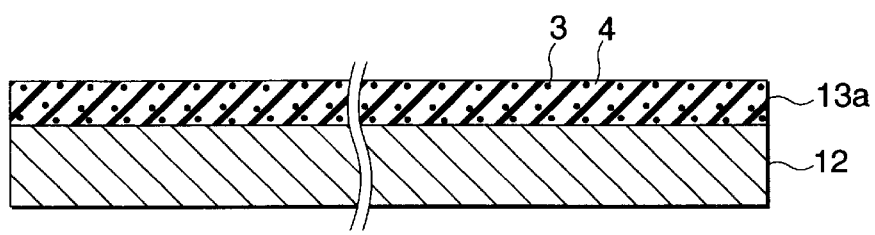

The photosensitive resin composition of the invention is applied to the entire surface of the substrate 12 (FIG. 4A) and dried at 40 to 150° C. to remove the solvent to form a photosensitive layer 13a in which the dispersible compound 3 is finely dispersed in the polyamic acid resin matrix 4 as shown in FIG. 4B.

Figure 4C:
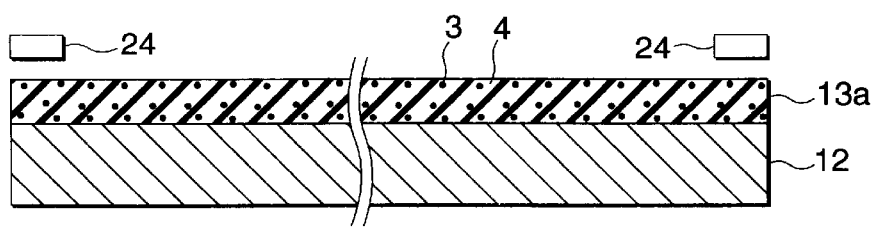

The photosensitive layer 13a is imagewise exposed to active light through a photo mask 24 having a prescribed pattern and developed with a developing solution to form a positive or negative image as shown in FIG. 4C. The light for exposure preferably has a wavelength of 300 to 450 nm, particularly 350 to 420 nm. The exposure (i.e., the integrated amount of light for exposure) is preferably 100 to 5000 mJ/cm$^2$, still preferably 200 to 3000 mJ/cm$^2$. The embodiment of FIGS. 4A to 4E is negative patterning.

Figure 4D:
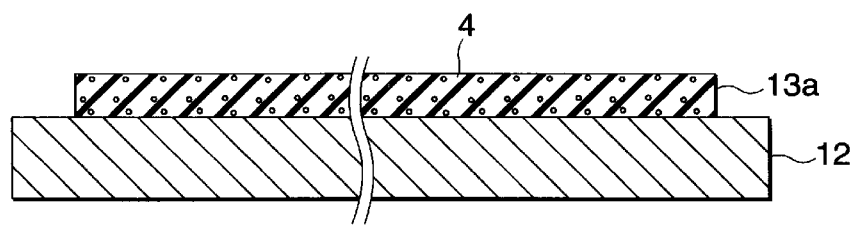

The dispersible compound 3 is removed from the layer 13a to make the polyamic acid resin 4 porous (FIG. 4D). Removal of the dispersible compound can be effected by heating, decomposition or extraction, preferably extraction.

Figure 4E:
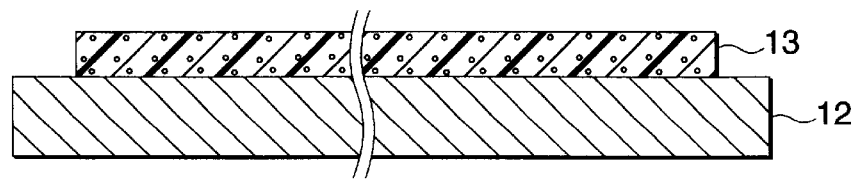

The layer 13a of the porous polyamic acid resin 4 is heated at about 350 to 400° C. for several hours to convert the polyamic acid resin 4 into a polyimide resin thereby forming a porous insulating layer 13 (FIG. 4E). The insulating layer 13 usually has a thickness of 2 to 20 μm, preferably 5 to 10 μm.

A conductive layer 14 having a prescribed circuit pattern is formed on the base layer 13 as shown in FIG. 5. The conductor which forms the conductive layer 14 is not particularly limited and includes copper, nickel, gold, solder and alloys thereof, with copper being preferred. The conductor can be patterned by any known patterning technique, such as a subtractive method, an additive method, and a semi-additive method. A semi-additive method as adopted in the embodiment shown in FIG. 5 is preferred. As shown in FIG. 5A, a thin film of a conductor, preferably chromium or copper, is provided as an undercoat 20 on the entire surface of the substrate 12 and the baselayer 13 preferably by vacuum deposition, particularly sputtering. The undercoat 20 is preferably formed by successively forming a chromium thin film and a copper thin film by sputtering. The chromium thin film and the copper thin film preferably have a deposit thickness of 100 to 600 Å and 500 to 2000 Å, respectively.

Figure 5A:
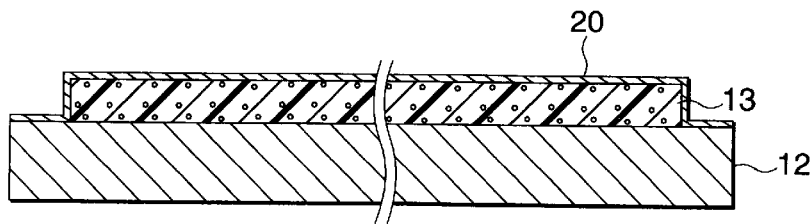
Figure 5B:
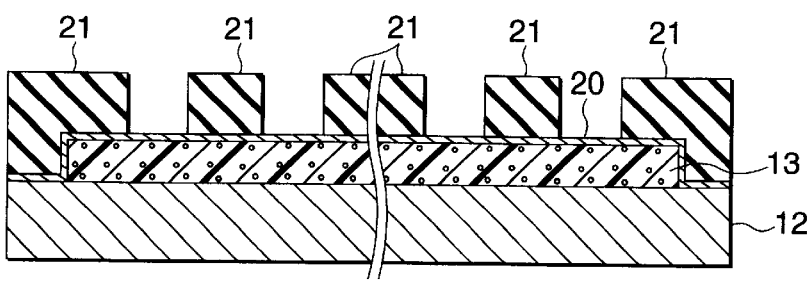
Figure 5C:
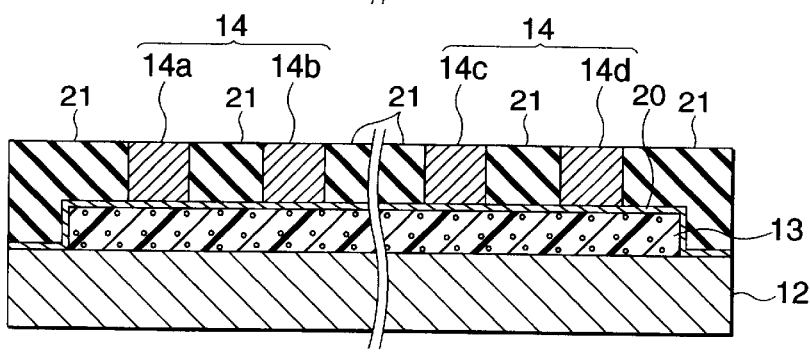
Figure 5D:
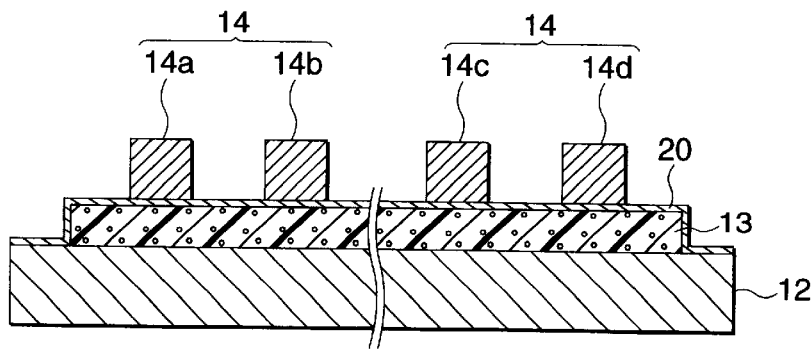

As shown in FIG. 5B, a plating resist 21 is formed on the undercoat 20 in a reverse pattern of a prescribed circuit pattern. The plating resist 21 can be formed in a known manner, for example by use of a dry film resist. A conductive layer 14 is formed in a prescribed circuit pattern by plating on the insulating layer 13 uncovered with the resist 21 via the undercoat 20. Plating can be carried out by either electroplating or electroless plating. Electroplating, particularly electroplating with copper is preferred. As stated above with reference to FIG. 3, the circuit pattern is composed of a plurality of wires 14a, 14b, 14c, and 14d which are spaced at predetermined intervals in parallel to each other. The thickness of the conductive layer 14 is usually 2 to 50 μm, preferably 5 to 30 μm. The width of each wire 14a, 14b, 14c or 14d is usually 5 to 500 μm, preferably 10 to 200 μm, and the interval between the wires 14a and 14b and between the wires 14c and 14d is usually 5 to 500 μm, preferably 10 to 200 μm.

Figure 5E:
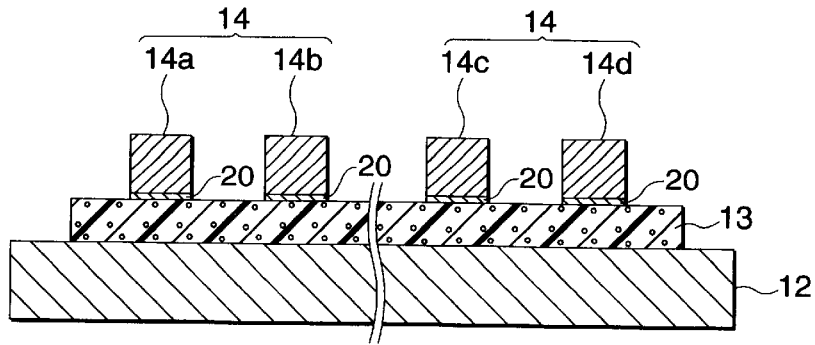

The plating resist 21 is stripped or removed by, for example, chemical etching (wet etching) (FIG. 5D), and the undercoat 20 on which the plating resist 21 has been formed is removed by, for example, chemical etching (wet etching) to form a circuit pattern made of the conductive layer 14 on the base layer 13 (FIG. 5E).

Figure 6A:
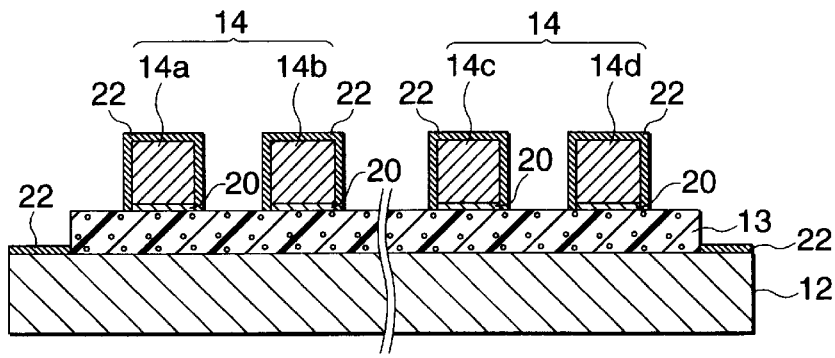
Figure 6B:
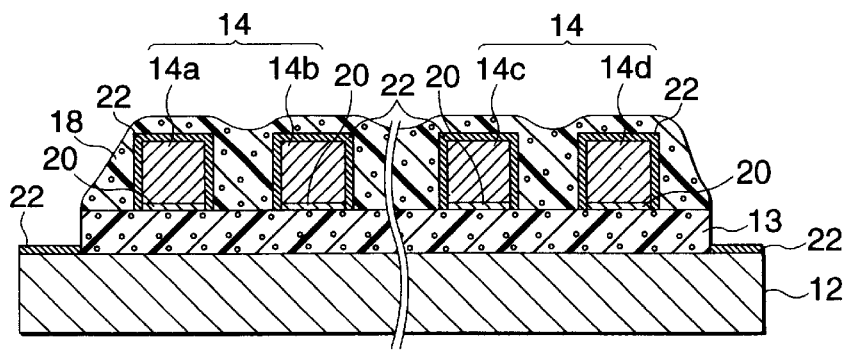
Figure 6C:
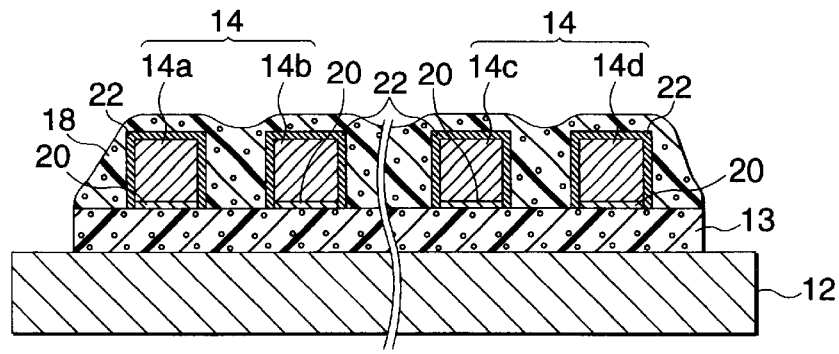

FIGS. 6A to 6C shows the process for protecting the conductive layer 14 with a metallic film 22 and covering the conductive layer 14 with a covering layer 18 made of an insulator. In FIG. 6A, a metallic film 22 is formed on the surface of the conductive layer 14 (the wires 14a, 14b, 14c, and 14d) and the exposed surface of the substrate 12. The metallic film 22 is preferably formed as a thin hard nickel film by electroless nickel plating. The thickness of the metallic film 22 is such that the conductive layer 14 may not be exposed, which is about 0.05 to 0.2 μm.

In FIG. 6B, a covering layer 18 is provided to cover the conductive layer 14. It can be formed of the same photosensitive resin composition in the same manner as for the base layer 13. Accordingly, the covering layer 18 comprises a porous polyimide resin (FIG. 6B). The thickness of the covering layer 18 is usually 2 to 25 µm, preferably 5 to 20 µm, while varying depending on the thickness of the conductive layer 14.

The metallic film 22 formed on the substrate 12 is stripped off (FIG. 6C) While not illustrated in FIG. 6, the terminals 16 on the magnetic head portion and the terminals 17 on the tail portion connected to an external circuit (see FIG. 3) are formed by masking these terminals while the covering layer 18 is formed over the conductive layer 14, stripping the metallic film 22 off the terminals simultaneously with the removal of the metallic film 22 from the substrate 12, and electroplating the thus exposed surface of the conductive layer 14 successively with nickel and gold. The nickel plating layer and the gold plating layer both preferably have a thickness of 0.2 to 5 µm.

The leads used in nickel electroplating and gold electroplating are removed by, for example, chemical etching. A prescribed part of the substrate 12 is engraved by a known method, such as chemical etching, to form a gimbal 15, etc. Finally, the product is washed and dried to obtain a wireless suspension board 11 shown in FIG. 3.

The circuit-provide suspension board 11 according to the present invention has a reduced dielectric constant and exhibits satisfactory high frequency characteristics. Therefore the circuit on the suspension board 11 is capable of transmitting huge quantities of information read or written with a magnetic head at a high speed.

The present invention will now be illustrated in greater detail with reference to Synthesis Examples, Examples and Comparative Examples, but it should be understood that the invention is not construed as being limited thereto. Unless otherwise noted, all the percents and parts are by weight.

SYNTHESIS EXAMPLE 1

Synthesis of Polyamic Acid Resin A

In a 500 ml separable flask equipped with a stirrer and a thermometer was put 27.0 g (0.25 mol) of p-phenylenediamine, and 402 g of N-methyl-2-pyrrolidone (NMP) was added thereto, followed by stirring to dissolve the p-phenylenediamine.

To the solution was slowly added 73.6 g (0.25 mol) of 3,3',4,4'-biphenyltetracarboxylic acid dianhydride, and the mixture was stirred at or below 30° C. for 2 hours to obtain a 20% solution of a polyamic acid resin (designated polyamic acid resin A). The polyamic acid resin A solution had an intrinsic viscosity of 1.5 (at a concentration of 0.5 g/100 ml in NMP, measured at 30° C.) and a solution viscosity of 800 Pa·s at 30° C.

SYNTHESIS EXAMPLE 2

Synthesis of Polyamic Acid Resin B

In a 500 ml separable flask equipped with a stirrer and a thermometer were charged 27.0 g (0.25 mol) of p-phenylenediamine, 66.20 g (0.225 mol) of 3,4,3',4'-biphenyltetracarboxylic acid dianhydride (diphthalic dianhydride), and 11.1 g (0.025 mol) of 2,2-bis(3,4-dicarboxyphenyl)hexafluoropropane, and 417 g of NMP was added thereto to dissolve the monomers. The solution was stirred at or below 30° C. for 2 hours to obtain a 20% solution of a polyamic acid resin (designated polyamic acid resin B). The polyamic acid resin B solution had an intrinsic viscosity of 1.7 (at a concentration of 0.5 g/100 ml in NMP, measured at 30° C.) and a solution viscosity of 820 Pa·s at 30° C.

SYNTHESIS EXAMPLE 3

Synthesis of Polyamic Acid Resin C

In a 500 ml separable flask equipped with a stirrer and a thermometer were charged 18.7 g (88.0 mmol) of 1,1'-dimethyl-4,4'-diaminobiphenyl, 9.0 g (22.0 mmol) of 2,2'-bis(4-aminophenoxyphenyl)propane, 19.2 g (88.0 mmol) of pyromellitic acid dianhydride, and 9.8 g (22.0 mmol) of 2,2'-bis(3,4'-dicarboxyphenyl)hexafluoropropane, and 227 g of NMP was added thereto to dissolve the monomers. The solution was stirred at or below 30° C. for 2 hours to obtain a 20% solution of a polyamic acid resin (designated polyamic acid resin C). The polyamic acid resin C solution had an intrinsic viscosity of 0.7 (at a concentration of 0.5 g/100 ml in NMP, measured at 30° C.) and a solution viscosity of 300 Pa·s at 30° C.

EXAMPLE 1

To the polyamic acid resin A solution obtained in Synthesis Example 1 were added 20.1 g (0.058 mol) of nifedipine and 20.1 g (0.064 mol) of the acetyl compound as photosensitive agents, and 38 parts of urethane acrylate having a weight average molecular weight of 1100 was added thereto per 100 parts of the polyamic acid resin A. The mixture was stirred to prepare a transparent uniform photosensitive resin composition.

The photosensitive resin composition was applied to a 25 µm-thick stainless steel foil (SUS304) as a substrate with a spin coater to a dry coating thickness of 15 µm and dried by heating at 90° C. for 15 minutes to remove NMP thereby to form a photosensitive layer in which the urethane acrylate formed micro-domains (i.e., sea-island structure) in the polyamic acid resin A matrix.

The photosensitive layer was exposed to ultraviolet light ($\lambda$=350 to 420 nm) through a photo mask at an exposure of 700 mJ/cm$^2$, heated in a hot air circulatory oven at 180° C. for 10 minutes, and developed negatively to form a pattern.

The substrate having the thus patterned polyamic acid resin layer was cut into a disc of 80 mm in diameter, and the disc was put in a 500 ml pressure vessel. The pressure vessel was pressurized to 25 MPa/cm$^2$ in an 40° C. atmosphere, and carbon dioxide was injected and discharged at a rate of about 3/min in terms of gas amount for 2 hours while maintaining the inner pressure to extract the urethane acrylate from the polyamic acid resin matrix. Thereafter the disc was heated to 380° C. under reduced pressure of 1.33 Pa to form a porous polyimide resin film.

Figure 7:
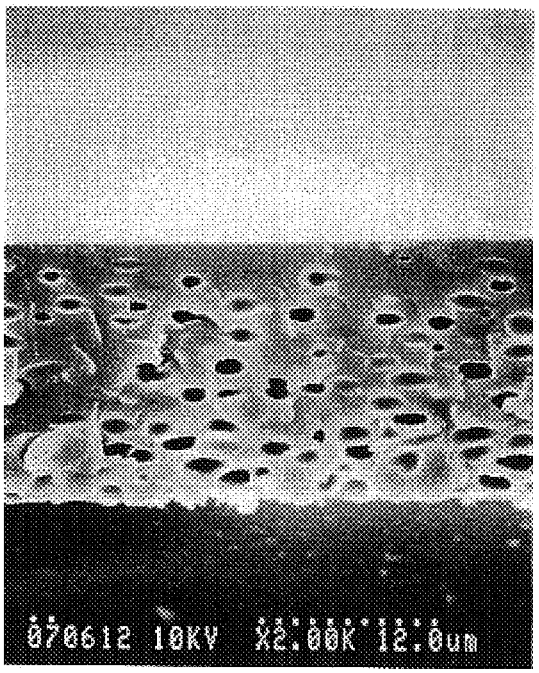
FIG. 7 is an electron scanning micrograph on a cut surface (cross section) of the porous film obtained in Example 1.

The micrograph under a scanning electron microscope (SEM) of the cut surface of the resulting porous film as image processed is shown in FIG. 7. The cell size was 2.5 µm. The dielectric constant was 2.75 at 1 MHz.

The conditions of measurement were as follows (hereinafter the same).

SEM Observation

The porous sheet was frozen in liquid nitrogen and broken, and the cut surface was observed through an SEM (S-570, supplied by Hitachi, Ltd.) at an accelerating voltage of 10 kV.

Dielectric Constant

Measured with HP4284A Precision LCR Meter, supplied by Yokogawa Hewlett Packard, Ltd.

EXAMPLE 2

To the polyamic acid resin A solution obtained in Synthesis Example 1 were added 20.1 g (0.058 mol) of nifedipine and 20.1 g (0.064 mol) of the acetyl compound as photosensitive agents, and 38 parts of polyethylene glycol diacrylate having a weight average molecular weight of 500 was added thereto per 100 parts of the polyamic acid resin A. The mixture was stirred to prepare a transparent uniform photosensitive resin composition.

The photosensitive resin composition was applied to a 25 μm-thick stainless steel foil (SUS304) as a substrate with a spin coater to a dry coating thickness of 15 μm and dried by heating at 90° C. for 15 minutes to remove NMP thereby to form a photosensitive layer in which the polyethylene glycol diacrylate formed micro-domains (i.e., sea-island structure) in the polyamic acid resin A matrix.

The photosensitive layer was exposed to ultraviolet light (λ=350 to 420 nm) through a photo mask at an exposure of 700 mJ/cm$^2$, heated in a hot air circulatory oven at 180° C. for 10 minutes, and developed negatively to form a pattern.

The layer having the thus patterned polyamic acid resin layer was cut into a disc of 80 mm in diameter, and the disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure to extract the polyethylene glycol diacrylate from the polyamic acid resin matrix. Thereafter the disc was heated to 380° C. under reduced pressure of 1.33 Pa to form a porous polyimide resin film.

Figure 8:
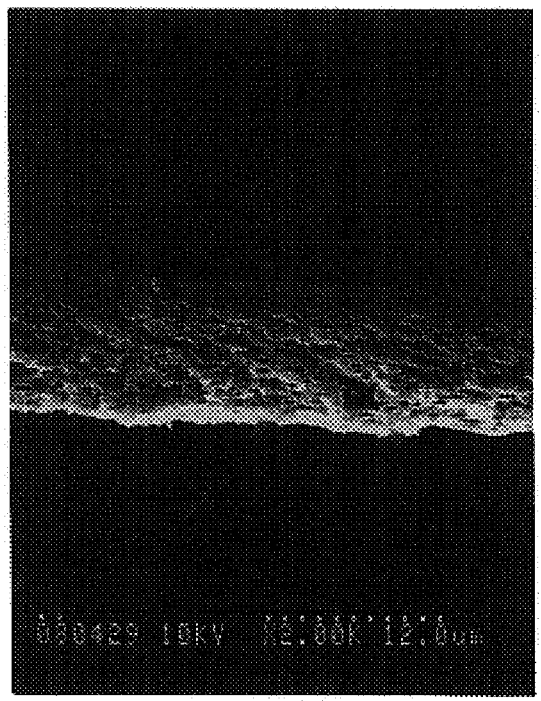
FIG. 8 is an electron scanning micrograph on a cut surface of the porous film obtained in Example 2.

The image-processed SEM micrograph of the cut surface of the resulting porous film is shown in FIG. 8. The cell size was 0.8 μm. The dielectric constant was 2.75 at 1 MHz.

EXAMPLE 3

To the polyamic acid resin A solution obtained in Synthesis Example 1 were added 20.1 g (0.058 mol) of nifedipine and 20.1 g (0.064 mol) of the acetyl compound as photosensitive agents, and 66 parts of polyethylene glycol diacrylate having a weight average molecular weight of 500 was added thereto per 100 parts of the polyamic acid resin A. The mixture was stirred to prepare a transparent uniform photosensitive resin composition.

The photosensitive resin composition was applied to a 25 μm-thick stainless steel foil (SUS304) with a spin coater to a dry coating thickness of 15 μm and dried by heating at 90° C. for 15 minutes to remove NMP thereby to form a photosensitive layer in which the polyethylene glycol diacrylate formed micro-domains (i.e., sea-island structure) in the polyamic acid resin A matrix.

The photosensitive layer was exposed to ultraviolet light (λ=350 to 420 nm) through a photo mask at an exposure of 700 mJ/cm$^2$, heated in a hot air circulatory oven at 180° C. for 10 minutes, and developed negatively to form a pattern.

The film having the thus patterned polyamic acid resin layer was cut into a disc of 80 mm in diameter, and the disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure to extract the polyethylene glycol diacrylate from the polyamic acid resin matrix. Thereafter the disc was heated to 350° C. under reduced pressure of 1.33 Pa to form a porous polyimide resin film.

Figure 9:
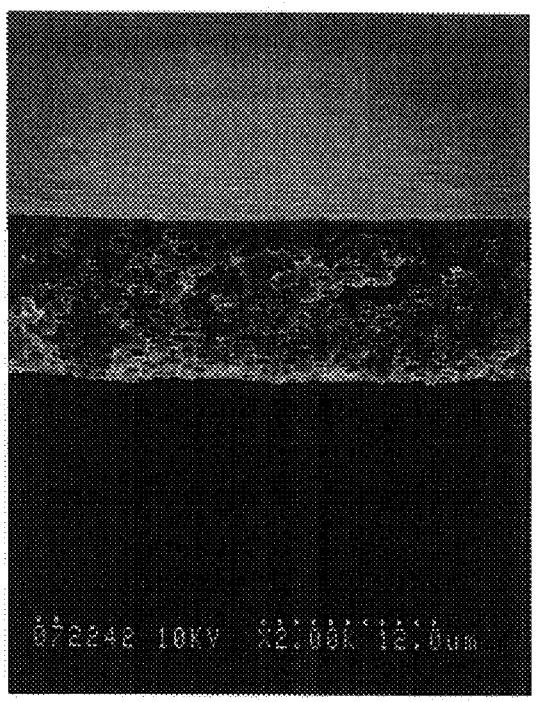
FIG. 9 is an electron scanning micrograph on a cut surface of the porous film obtained in Example 3.

The image-processed SEM micrograph of the cut surface of the resulting porous film is shown in FIG. 9. The cell size was 1.0 μm. The dielectric constant was 2.24 at 1 MHz.

EXAMPLE 4

To the polyamic acid resin B solution obtained in Synthesis Example 2were added 20.9 g (0.060 mol) of nifedipine and 20.9 g (0.066 mol) of the acetyl compound as photosensitive agents, and 38 parts of urethane acrylate having a weight average molecular weight of 600 was added thereto per 100 parts of the polyamic acid resin B. The mixture was stirred to prepare a transparent uniform photosensitive resin composition.

The photosensitive resin composition was applied to a 25 μm-thick stainless steel foil (SUS304) with a spin coater to a dry coating thickness of 15 μm and dried by heating at 90° C. for 15 minutes to remove NMP thereby to form a photosensitive layer in which the urethane acrylate formed micro-domains (i.e., sea-island structure) in the polyamic acid resin B matrix.

The photosensitive layer was exposed to ultraviolet light (λ=350 to 420 nm) through a photo mask at an exposure of 700 mJ/cm$^2$, heated in a hot air circulatory oven at 180° C. for 10 minutes, and developed negatively to form a pattern.

The film having the thus patterned polyamic acid resin layer was cut into a disc of 80 mm in diameter. The disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure to extract the urethane acrylate from the polyamic acid resin matrix. Thereafter the disc was heated to 400° C. under reduced pressure of 1.33 Pa to form a porous polyimide resin film.

Figure 10:
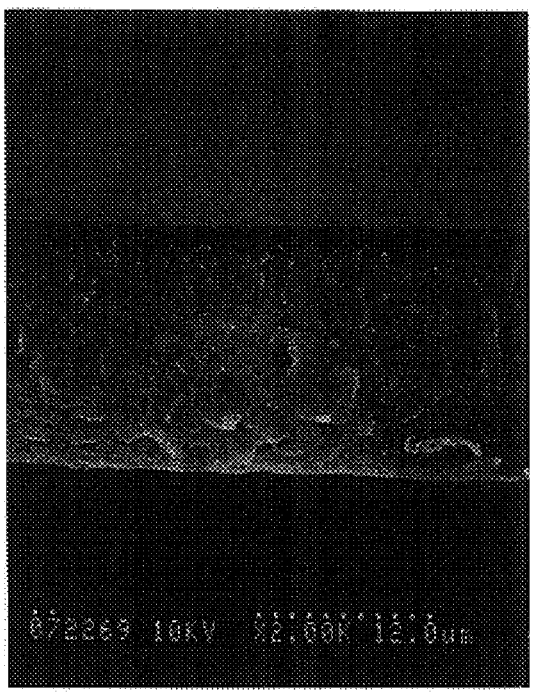
FIG. 10 is an electron scanning micrograph on a cut surface of the porous film obtained in Example 4.

The image-processed SEM micrograph of the cut surface of the resulting porous film is shown in FIG. 10. The cell size was 0.5 μm. The dielectric constant was 2.96 at 1 MHz.

EXAMPLE 5

To the polyamic acid resin C solution obtained in Synthesis Example 3 were added 11.3 g (0.033 mol) of nifedipine and 11.3 g (0.036 mol) of the acetyl compound as photosensitive agents, and 38 parts of urethane acrylate having a weight average molecular weight of 2600 was added thereto per 100 parts of the polyamic acid resin C. The mixture was stirred to prepare a transparent uniform photosensitive resin composition.

The photosensitive resin composition was applied to a 25 μm-thick stainless steel foil (SUS304) with a spin coater to a dry coating thickness of 15 μm and dried by heating at 90° C. for 15 minutes to remove NMP thereby to form a photosensitive layer in which the urethane acrylate formed micro-domains (i.e., sea-island structure) in the polyamic acid resin C matrix.

The photosensitive layer was exposed to ultraviolet light (λ=350 to 420 nm) through a photo mask at an exposure of 700 mJ/cm$^2$, heated in a hot air circulatory oven at 180° C. for 10 minutes, and developed negatively to form a pattern.

The film having the thus patterned polyamic acid resin layer was cut into a disc of 80 mm in diameter. The disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure to extract the urethane acrylate from the polyamic acid resin matrix. Thereafter the disc was heated to 380° C. under reduced pressure of 1.33 Pa to form a porous polyimide resin film.

Microscopic observation of the cut surface of the resulting porous film under an SEM revealed that the cell size was 1.0 μm. The dielectric constant was 2.96 at 1 MHz.

EXAMPLE 6

To the polyamic acid resin A solution obtained in Synthesis Example 1 were added 20.1 g (0.058 mol) of nifedipine and 20.1 g (0.064 mol) of the acetyl compound as photosensitive agents, and 38 parts of polyethylene glycol monomethyl ether methacrylate having a weight average molecular weight of 500 was added thereto per 100 parts of the polyamic acid resin A. The mixture was stirred to prepare a transparent uniform photosensitive resin composition.

The photosensitive resin composition was applied to a 25 µm-thick stainless steel foil (SUS304) with a spin coater to a dry coating thickness of 15 µm and dried by heating at 90° C. for 15 minutes to remove NMP thereby to form a photosensitive layer in which the polyethylene glycol monomethyl ether methacrylate formed micro-domains (i.e., sea-island structure) in the polyamic acid resin A matrix.

The photosensitive layer was exposed to ultraviolet light ($\lambda$=350 to 420 nm) through a photo mask at an exposure of 700 mJ/cm$^2$, heated in a hot air circulatory oven at 180° C. for 10 minutes, and developed negatively to form a pattern.

The film having the thus patterned polyamic acid resin layer was cut into a disc of 80 mm in diameter. The disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure to extract the polyethylene glycol monomethyl ether methacrylate from the polyamic acid resin matrix. Thereafter the disc was heated to 380° C. under reduced pressure of 1.33 Pa to form a porous polyimide resin film.

Microscopic observation of the cut surface of the resulting porous film under an SEM revealed that the cell size was 1.0 µm. The dielectric constant was 2.00 at 1 MHz.

EXAMPLE 7

To the polyamic acid resin B solution obtained in Synthesis Example 2 were added 20.9 g (0.060 mol) of nifedipine and 20.9 g (0.066 mol) of the acetyl compound as photosensitive agents, and 38 parts of polyethylene glycol monomethacrylate having a weight average molecular weight of 450 was added thereto per 100 parts of the polyamic acid resin B. The mixture was stirred to prepare a transparent uniform photosensitive resin composition.

The photosensitive resin composition was applied to a 25 µm-thick stainless steel foil (SUS304) with a spin coater to a dry coating thickness of 15 µm and dried by heating at 90° C. for 15 minutes to remove NMP thereby to form a photosensitive layer in which the urethane acrylate formed micro-domains (i.e., sea-island structure) in the polyamic acid resin B matrix.

The photosensitive layer was exposed to ultraviolet light ($\lambda$=350 to 420 nm) through a photo mask at an exposure of 700 mJ/cm$^2$, heated in a hot air circulatory oven at 180° C. for 10 minutes, and developed negatively to form a pattern.

The film having the thus patterned polyamic acid resin layer was cut into a disc of 80 mm in diameter. The disc was put in a 500 ml pressure vessel. The pressure vessel was pressurized to 25 MPa/cm$^2$ in an 40° C. atmosphere, and carbon dioxide was injected and discharged at a rate of about 3/min in terms of gas amount for 2 hours while maintaining the inner pressure to extract the urethane acrylate from the polyamic acid resin matrix. Thereafter the disc was heated to 380° C. under reduced pressure of 1.33 Pa to form a porous polyimide resin film.

Microscopic observation of the cut surface of the resulting porous film under an SEM revealed that the cell size was 0.1 µm. The dielectric constant was 2.87 at 1 MHz.

COMPARATIVE EXAMPLE 1

To the polyamic acid resin A solution obtained in Synthesis Example 1 were added 20.9 g (0.060 mol) of nifedipine and 20.9 g (0.066 mol) of the acetyl compound as photosensitive agents. The mixture was stirred to prepare a transparent uniform photosensitive resin composition. This photosensitive resin composition was applied to a 25 µm-thick stainless steel foil (SUS304) as a substrate with a spin coater to a dry coating thickness of 15 µm and dried by heating at 90° C. for 15 minutes to remove NMP thereby to form a polyamic acid resin layer, which was found to be uniform with no sea-island structure under SEM observation.

The resin layer was exposed to ultraviolet light ($\lambda$=350 to 420 nm) through a photo mask at an exposure of 700 mJ/cm2, heated in a hot air circulatory oven at 180° C. for 10 minutes, and developed negatively to form a pattern.

The film having the thus patterned polyamic acid resin layer was cut into a disc of 80 mm in diameter. The disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure. Thereafter the disc was heated to 380° C. under reduced pressure of 1.33 Pa to form a polyimide resin film.

Figure 11:
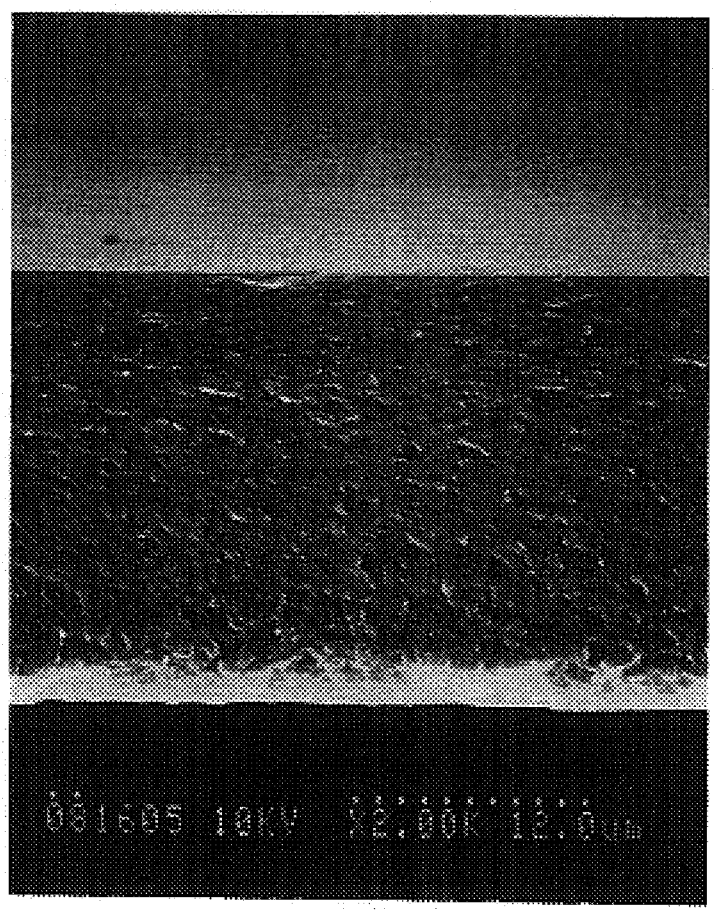
FIG. 11 is an electron scanning micrograph on a cut surface of the porous film obtained in Comparative Example 1.

The SEM micrograph of the cut surface of the resulting polyimide film is shown in FIG. 11, in which no cells are observed. The dielectric constant of the film was 3.17 at 1 MHz.

COMPARATIVE EXAMPLE 2

To the polyamic acid resin B solution obtained in Synthesis Example 2 were added 20.9 g (0.060 mol) of nifedipine and 20.9 g (0.066 mol) of the acetyl compound as photosensitive agents.

The mixture was stirred to prepare a transparent uniform photosensitive resin composition. This photosensitive resin composition was applied to a 25 µm-thick stainless steel foil (SUS304) with a spin coater to a dry coating thickness of 15 µm and dried by heating at 90° C. for 15 minutes to remove NMP thereby to form a polyamic acid resin layer, which was found to be uniform with no sea-island structure under SEM observation.

The resin layer was exposed to ultraviolet light ($\lambda$=350 to 420 nm) through a photo mask at an exposure of 700 mJ/cm$^2$, heated in a hot air circulatory oven at 180° C. for 10 minutes, and developed negatively to form a pattern.

The film having the thus patterned polyamic acid resin layer was cut into a disc of 80 mm in diameter. The disc was put in a 500 ml pressure vessel. The pressure vessel was pressurized to 25 MPa/cm$^2$ in an 40° C. atmosphere, and carbon dioxide was injected and discharged at a rate of about 3 l/min in terms of gas amount for 2 hours while maintaining the inner pressure. Thereafter the disc was heated to 380° C. under reduced pressure of 1.33 Pa to form a polyimide resin film.

The cut surface of the resulting polyimide film was found to have no cells under SEM observation. The dielectric constant of the film was 3.20 at 1 MHz.

COMPARATIVE EXAMPLE 3

To the polyamic acid resin A solution obtained in Synthesis Example 1 were added 20.1 g (0.058 mol) of nifedipine and 20.1 g (0.064 mol) of the acetyl compound as photosensitive agents, and 38 parts of hydroxyethyl methacrylate having a molecular weight of 130 was added thereto per 100 parts of the polyamic acid resin A, followed by stirring to prepare a transparent uniform photosensitive resin composition.

The photosensitive resin composition was applied to a 25 μm-thick stainless steel foil (SUS304) with a spin coater to a dry coating thickness of 15 μm and dried by heating at 90° C. for 15 minutes to remove NMP thereby to form a photosensitive layer, which was found to be uniform with no sea-island structure under SEM observation.

COMPARATIVE EXAMPLE 4

To the polyamic acid resin A solution obtained in Synthesis Example 1 were added 20.1 g (0.058 mol) of nifedipine and 20.1 g (0.064 mol) of the acetyl compound as photosensitive agents, and 38 parts of 1,4-butanediol having a molecular weight of 90 was added thereto per 100 parts of the polyamic acid resin A, followed by stirring to prepare a transparent uniform photosensitive resin composition.

The photosensitive resin composition was applied to a 25 μm-thick stainless steel foil (SUS304) with a spin coater to a dry coating thickness of 15 μm and dried by heating at 90° C. for 15 minutes to remove NMP thereby to form a photosensitive layer, which was found to be uniform with no sea-island structure under SEM observation.

COMPARATIVE EXAMPLE 5

To the polyamic acid resin A solution obtained in Synthesis Example 1 were added 20.1 g (0.058 mol) of nifedipine and 20.1 g (0.064 mol) of the acetyl compound as photosensitive agents, and 38 parts of ethylene glycol having a molecular weight of 60 was added thereto per 100 parts of the polyamic acid resin A, followed by stirring to prepare a transparent uniform photosensitive resin composition.

The photosensitive resin composition was applied to a 25 μm-thick stainless steel foil (SUS304) with a spin coater to a dry coating thickness of 15 μm and dried by heating at 90° C. for 15 minutes to remove NMP thereby to form a photosensitive layer, which was found to be uniform with no sea-island structure under SEM observation.

As described above, the photosensitive resin composition according to the invention provides a porous resin which has high heat resistance, dimensional stability and insulating properties and contains uniform and fine cells. The porous resin obtained therefrom therefore exhibits a low dielectric constant and is capable of forming a fine pattern. Where used as an insulating layer of a circuit board, the porous resin brings about improved high frequency characteristics owing to its low dielectric constant. Such a circuit board will be effective in transmitting high frequency electrical signals at a high speed.

In particular, where the porous resin is applied to a wireless suspension board, the wireless suspension board is capable of transmitting vast quantities of information read and written by a magnetic head at a high speed.

The entire disclosure of each and every foreign patent application from which the benefit of foreign priority has been claimed in the present application is incorporated herein by reference, as if fully set forth.

We claim:

1. A photosensitive resin composition comprising a polyamic acid resin, a photosensitive agent, a dispersible compound dispersible in the polyamic acid resin, and a solvent wherein the amount of the photosensitive agent is 0.05 to 0.5 mol per mol of the polyamic acid resin.

2. The photosensitive resin composition according to claim 1, wherein the dispersible compound is at least one compound selected from the group consisting of a polyacrylate oligomer, a polyether oligomer, a polyester oligomer, and a polyurethane oligomer.

3. The photosensitive resin composition according to claim 1, wherein the amount of dispersible compound is 10 to 200 parts by weight per 100 parts by weight of the polyamic acid resin.

* * * * *